United States Patent [19]

Apilat et al.

[11] 4,190,630
[45] Feb. 26, 1980

[54] APPARATUS FOR PULLING SINGLE CRYSTALS FROM MELT

[75] Inventors: Vitaly Y. Apilat; Marx I. Litichevsky; Oleg S. Mjulendorf; Lev G. Eidelman, all of Kharkov, U.S.S.R.

[73] Assignee: Vsesojuzny Nauchno-Isslekovatelsky Institut Monokristallov Stsintillyatsionnykh Materialov I Osobo Chistykh Khimicheskikh Veschestv, Kharkov, U.S.S.R.

[21] Appl. No.: 866,812

[22] Filed: Jan. 3, 1978

[51] Int. Cl.² .............................................. B01J 17/18
[52] U.S. Cl. .............................. 422/249; 156/617 SP; 156/618; 156/DIG. 98
[58] Field of Search .............. 23/273 SP; 156/617 SP, 156/DIG. 93, DIG. 98; 422/249

[56] References Cited

U.S. PATENT DOCUMENTS

| | | | |
|---|---|---|---|
| 2,975,036 | 3/1961 | Taylor | 23/273 SP |
| 3,094,006 | 6/1963 | Hamilton | 23/267 SP |
| 3,511,609 | 5/1970 | Kato | 23/273 SP |
| 3,795,488 | 3/1974 | Oliver | 23/273 SP |
| 3,865,554 | 2/1975 | Wenckus | 156/617 SP |
| 3,966,416 | 6/1976 | Tranchart | 23/273 SP |

FOREIGN PATENT DOCUMENTS

| | | |
|---|---|---|
| 1080071 of 1960 | Fed. Rep. of Germany | 156/617 SP |
| 2422402 of 1975 | Fed. Rep. of Germany | 156/617 SP |
| 2013820 of 1970 | France | 156/617 SP |

OTHER PUBLICATIONS

Lehovec et al., The Rev. of Sci. Instuc., vol. 24, #8, Aug., 1953, pp. 652-655.
Whipps, J. of Cryst. Growth, vol. 12, #2, 1972, pp. 120-124.
Bardsley et al., J. of Cryst. Growth, vol. 16, 1972, pp. 277-279.
Gremmelmaier, Czochralski Techique (about 1962), pp. 254 to 265.

*Primary Examiner*—Stephen J. Emery
*Attorney, Agent, or Firm*—Steinberg & Blake

[57] ABSTRACT

An apparatus is designed for pulling oriented large-size single crystals from melt.

The apparatus comprises a hollow rod having a seed crystal holder. The rod drive comprises a drive shaft mounted in the rod coaxially therewith, the rod and the drive shaft being in engagement for combined rotation and for reciprocations of the rod together with a carriage axially along the drive shaft.

4 Claims, 1 Drawing Figure

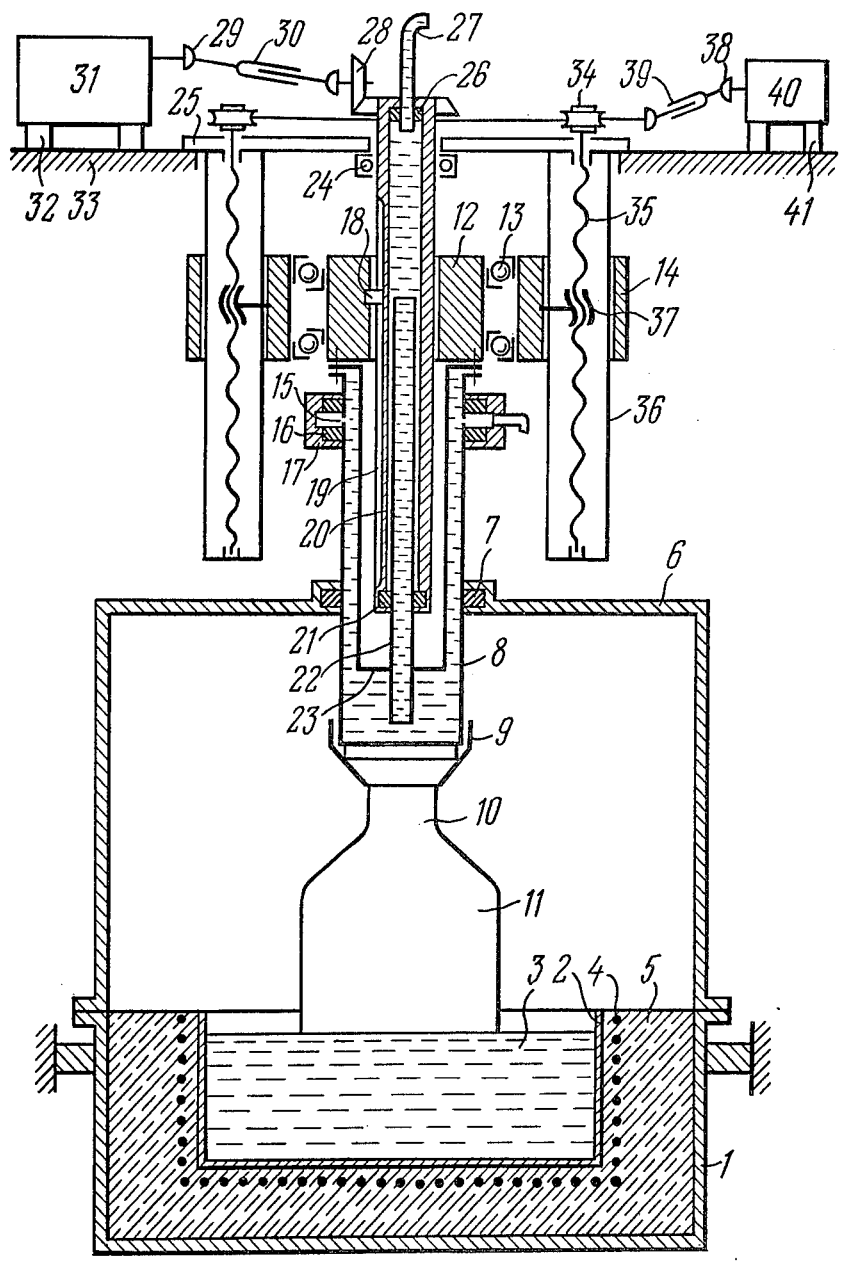

APPARATUS FOR PULLING SINGLE CRYSTALS FROM MELT

The invention relates to apparatus for growing single crystals from melt, and more particularly to apparatus for pulling single crystals from melt on a seed crystal.

The invention may be most efficiently used in growing oriented large-size single crystals of large length and diameter from melt, such as optical and scintillation alkali halide single crystals and semiconductor single crystals (germanium, silicon).

Nowadays a wide use is made of apparatus for pulling single crystals from melt on a cooled rotary seed crystal by the Czochralski method. Compared to other known methods of growing crystals, pulling them by the Czochrlaski method permits single crystals of better quality to be obtained (as regards high purity, high perfectness of structure, precise crystallographic orientation, more uniform distribution of impurities in case of doping).

Known apparatus for pulling single crystals from melt on seed crystal comprise an airtight chamber, a crucible and a heater accommodated therein, a water cooled rod having a seed crystal holder, drives for causing rotation and reciprocations of the rod which consist of electric motors and mechanical transmissions. Mechanical transmissions are rigidly secured in the casing of the chamber and are in a force transmitting connection with the rod, and the electric motors are mounted on shock absorbers and connected by means of elastic couplings to the mechanical part of the drive to reduce vibrations.

These constructions are deficient in that the vibrations produced by the mechanical transmission are directly transmitted to the rod with the seed crystal holder thus resulting in vibrations of the growing single crystal and melt in the crucible, hence in disturbances of the stability of single crystal growth.

Known in the art is also an apparatus for pulling single crystals from the melt, which comprises the reciprocatory and rotary drives of the seed crystal holder rod and additionally includes a device for suspending the seed crystal holder.

In order to eliminate pendulum motion of the seed crystal holder and avoid vibrations transmission thereto, the device for suspending the seed crystal holder comprises a chain formed by a number of hollow spherical members with the outer diameter of the spheres providing for their frictional engagement with a sleeve which is compled with the rotary drive for causing rotation of the seed crystal holder. The spheres are movably interconnected by means of rigid links having transverse dimensions smaller than that of the sphere.

This construction of the device for suspending the seed crystal holder eliminates vibrations transmission thereto; however, it does not enable its use when growing crystals with forced cooling of the seed crystal holder since it is not possible to reliably seal the chain members, hence coolant cannot be circulated therein.

Known in the art is also an apparatus for pulling crystals by the Czochralski method in which the torque from the drive is transmitted to the rod of the seed crystal holder by means of a belt.

The disadvantage of such a construction consists in that, due to the flexibility of the belt, the rotation of the seed crystal holder is non-uniform, thus resulting in low-frequency vibrations of the single crystal which are especially dangerous when growing heavy weight single crystals of large size since the probability of their premature separation because of rupture of seed crystal is high.

Known in the art is an apparatus for pulling single crystals from melt comprising a water cooled rod having a seed crystal holder and mounted on a movable carriage, and rotary and reciprocatory drives of the rod.

Rotary and reciprocatory drives of the rod comprising electric motors and a gear box are installed on a rigid frame by means of elastic members absorbing vibrations. The movable carriage in which the seed crystal holder rod is journalled in rolling contact bearings is reciprocatable axially along the rod axis in guides by means of a motion screw transmission coupled to the rod drive.

The torque from the drive is transmitted via a flexible coupling to a splined shaft which is installed directly adjacent to and in parallel with the rod, and from the splined shaft via a gearing, to the rod and the seed crystal holder. During the reciprocations of the carriage with the rod and seed crystal holder, the drive gear of the gearing moves along the splines of the splined shaft.

This apparatus is deficient in that direct transmission of torque to the rod and seed crystal holder, via the gearing, results in vibrations of the rod and seed crystal holder, thus resulting in impaired quality of single crystals and increased probability of premature separation of the single crystal, especially in growing heavy weight large-size single crystals.

It is an object of the invention to improve quality of grown single crystal.

Another object of the invention is to improve reliability of the apparatus for growing single crystals.

Other objects and advantages of the invention are achieved by that in an apparatus for pulling single crystals from melt comprising a hollow rod having a seed crystal holder and mounted in a carriage for reciprocations along the longitudinal vertical axis of the rod together with the seed crystal, a drive for rotating the rod about its longitudinal axis in the carriage and a cooling system of the rod, according to the invention, the drive of the rod comprises a drive shaft installed inside the hollow rod coaxially therewith so as to define a space therebetween, the rod and the drive shaft are in engagement for combined rotation of the rod and the drive shaft about its longitudinal axis and for reciprocations of the rod together with the carriage axially along the longitudinal axis of the drive shaft.

In accordance with one embodiment of the invention, the engagement comprises a pin rigidly secured to the rod and a longitudinal groove provided in the outer periphery of the drive shaft to receive the pin, the space between the rod and the drive shaft accommodating a sleeve with a pipe rigidly secured to the rod and embracing the drive shaft, and the space between the sleeve and the rod communicating with means providing circulation of coolant therein.

The invention substantially reduces vibrations of the seed crystal holder rod due to the transmission of rotary motion to the rod by means of the pin rigidly secured to the rod and longitudinal groove in the outer periphery of the drive shaft. This construction minimizes the contact area of links participating in the transmission of torque and enables their free relative movement in radial and axial directions thus considerably reducing vibrations and improving the quality of single crystals being grown. In case a single crystal of a great mass is grown, when vibrations of the seed crystal holder rod may result in premature separation of the single crystal from the seed crystal, the invention ensures substantial improvement of reliability of the apparatus for pulling single crystals in operation.

Other objects and advantages of the invention will be understood from the following detailed description of a specific embodiment thereof illustrated in the accompanying drawing diagrammatically showing a vertical section of the apparatus for pulling single crystals from melt, according to the invention.

The apparatus comprises an airtight chamber 1 accommodating a crucible 2 containing melt 3. The crucible 2 is surrounded by a heater 4 installed in a lining 5. The chamber 1 has a cover plate 6 with a packing 7 for the passage of a vertical rod 8 which is hollow and has bottom wall. A holder 9 is secured to the lower end of the rod 8 for receiving a seed crystal 10 on which a single crystal 11 is grown. The upper end of the rod 8 is secured to a sleeve 12 journalled in bearings 13 in a carriage 14. To deliver the coolant from the rod 8, openings 15 are provided in the upper part of the rod 8 in the wall thereof between two seals 16 of a manifold 17.

A pin 18 is rigidly secured to the sleeve 12 and is loosely received in a groove 19 of a drive shaft 20 which is installed coaxially with the rod 8. The drive shaft 20 is hollow, and its lower end is provided with a packing 21 which serves for the passage into the inner space of the drive shaft 20 of a pipe 22 sealingly secured to the bottom wall of a sleeve 23 rigidly secured to the rod 8, and disposed between the rod 8 and the drive shaft 20.

The upper end of drive shaft 20 is journalled in bearings 24 on a plate 25. The upper end of the drive shaft 20 has an internal packing 26 to pass a pipe 27. The upper end of the drive shaft 20 is connected, via a gearing 28, flexible couplings 29 and a splined shaft 30, to a drive 31 for rotating the rod 8, which is secured to a frame 33 by means of shock absorbers 32. Two worm gearings 34 are mounted on the plate 25 rigidly secured to the frame 33, and the output shafts of the gearings have two motion screws 35 extending in hollow guides 36 (secured to the plate 25). The motion screws 35 have nuts 37 rigidly connected to the carriage 14. The worm gearings 34 are connected, by means of flexible couplings 38 and a splined shaft 39, to a drive 40 for reciprocating the rod 8, which is mounted by means of shock absorbers 41 on the frame 33.

The apparatus functions in the following manner. Starting material is charged in the crucible 2, and the seed crystal 10 is secured to the rod 8 by means of the holder 9. The chamber 1 is sealed off, and the starting material is melted by means of the heater 4. Before the heater 4 is put on, the system for cooling the rod 8 is put on. Thus coolant is fed to the rod 8 removed through the pipe 27, pipe 22, into the space between the rod 8 and the sleeve 23, which serves for the passage into the inner space of the drive shaft 20 of a pipe 22 sealingly secured to the bottom wall of a sleeve 23 rigidly secured to the rod 8, and disposed between the rod 8 and the drive shaft 20.

The upper end of the drive shaft 20 is journalled in bearings 24 on a plate 25. The upper end of the drive shaft 20 has an internal packing 26 to pass a pipe 27. The upper end of the drive shaft 20 is connected, via a gearing 28, flexible couplings 29 and a splined shaft 30, to a drive 31 for rotating the rod 8, which is secured to a frame 33 by means of shock absorbers 32. Two worm gearings 34 are mounted on the plate 25 rigidly secured to the frame 33, and the output shafts of the gearings have two motion screws 35 extending in hollow guides 36 (secured to the plate 25). The motion screws 35 have nuts 37 rigidly connected to the carriage 14. The worm gearings 34 are connected, by means of flexible couplings 38 and a splined shaft 39, to a drive 40 for reciprocating the rod 8, which is mounted by means of shock absorbers 41 on the frame 33.

The apparatus functions in the following manner. Starting material is charged in the crucible 2, and the seed crystal 10 is secured to the rod 8 by means of the holder 9. The chamber 1 is sealed off, and the starting material is melted by means of the heater 4. Before the heater 4 is put on, the sysem for cooling the rod 8 is put on. Thus coolant fed to the rod 8 is removed through the pipe 27, pipe 22, into the space between the rod 8 and the sleeve 23, and the coolant is removed through the openings 15 of the rod 8 between the seals 16, into the manifold 17. The rotary drive 31 of the rod 8 is put on to cause rotation of the sleeve 12, hence of the rod 8 and the seed crystal 10, via the flexible couplings 29, splined shaft 30, gearing 28, drive shaft 20 and pin 18. After a desired temperature of the melt 3 is established, the drive 40 for reciprocating the rod 8 along the shaft 20 is put on.

Torque is transmitted by means of the flexible couplings 38, splined shaft 39 and worm gearings 34 to the motion screws 35 which cause, by means of the nuts 37, the lowering of the carriage 14 in the guides 36, hence of the rod 8 and the seed crystal 10, until the seed crystal comes in contact with the melt 3.

After the growing of the crystal 11 has started, the drive 40 is put on to cause the reversed movement of the rod 8 so that the rod 8, the seed crystal 10 and the growing single crystal 11 move upwards at a speed ensuring the growth of the single crystal 11 of desired diameter.

After the growth of the single crystal 11 is completed, the crystal 11 is separated from the melt 3 by raising the speed of upward movement of the rod 8. The coolant supply is cut off, the drive 31 for rotating the rod 8 and the heater 4 are put off, the chamber 1 is unsealed, and the single crystal 11 is removed.

The installation of the drives 31, 40 on the shock absorbers 32 and 41 and the transmission of torque to the rod 8 and the seed crystal 10 via the coaxial shaft 20 by means of the pin 18 rigidly secured to the rod 8 supporting the holder 9 and loosely received in the groove 19 of the drive shaft 20 eliminate the transmission of vibrations of the drives 31, 40 on the single crystal 11 being grown thus enabling the growth of high quality large-size single crystals.

What we claim is:

1. An apparatus for pulling single crystals from melt comprising: a hollow rod having a seed crystal holder; carriage means in which said rod is mounted for axially moving said rod in a reciprocating manner with said seed crystal along a vertical axis; first drive means for moving said carriage means in a reciprocating manner; second drive means for rotating said rod in said carriage means, said second drive means including a drive shaft located and extending within said hollow rod coaxially therewith defining a space therebetween; means for rotating said drive shaft; means for engaging said rod and said drive shaft for combined rotation of both said drive shaft and said rod about the longitudinal axis of said drive shaft and for axial reciprocating movement of said rod with said carriage with respect to and axially along said drive shaft, said engagement means comprising a radially extending pin rigidly secured at one end to the rod and a longitudinally extending groove provided in the outer periphery of the drive shaft receiving for slidable movement therein the free end of the pin; a sleeve disposed in said space between the rod and the drive shaft surrounding a substantial portion of the length of the drive shaft; a pipe longitudinally extending within said drive shaft rigidly secured to the rod; and means for providing circulation of coolant within the space between the sleeve and the rod.

2. An apparatus for pulling single crystals from melt comprising: a hollow rod having a seed crystal holder; carriage means in which said rod is mounted for axially moving said rod in a reciprocating manner with said seed crystal along a vertical axis; a rotatably mounted screw member located adjacent to said carriage means extending substantially parallely to said rod; a screw follower member mounted on said screw member and rigidly connected to said carriage means; means for rotating said screw member whereby said rod is axially moved along a vertical axis; drive means for rotating said rod in said carriage means including a drive shaft located and extending within said hollow rod coaxially therewith defining a space therebetween, a radially extending pin rigidly secured at one end to the rod and a longitudinally extending groove provided in the outer periphery of the drive shaft receiving for slidable movement therein the free end of the pin, whereby combined rotation of both said drive shaft and said rod about the longitudinal axis of said drive shaft and axial reciprocating movement of said rod with said carriage with respect to and axially along said drive shaft is permitted; and means for cooling said rod including a sleeve being accommodated in said space between the rod and the drive shaft surrounding a substantial portion of the length of said drive shaft, a pipe longitudinally extending within said drive shaft rigidly secured to the rod, and means for providing circulation of coolant within the space between the sleeve and the rod.

3. An apparatus for pulling single crystals from melt comprising: a hollow rod having a seed crystal holder; carriage means in which said rod is mounted for reciprocating movement with said seed crystal along a vertical axis; first drive means for reciprocating said carriage means; second drive means for rotating said rod in said carriage; a cooling system for cooling said hollow rod and seed crystal holder including a central pipe assembly mounted within said hollow rod coaxially therewith, a space being defined between said central pipe assembly and said hollow rod adapted to deliver a cooling agent to the lower rod end contacting the seed crystal, said central pipe assembly including a vertically fixed rotatable external member having a longitudinally extending groove formed on its external surface, the length of said groove being at least as long as the extent of vertical travel of said hollow rod during reciprocation thereof, a vertically movable internal member telescopingly mounted within said external member having a fluid seal being provided therebetween, and a sleeve member mounted within the space between said hollow rod and said external member coaxially therewith which envelopes a substantial longitudinal portion of said external member, said internal member being rigidly fixed to the lower end of said sleeve member, the latter being rigidly attached to said hollow rod; a radially extending pin having one end fixed to the upper end of said hollow rod and its other end extending into said groove formed in said external member; and means for circulating a cooling agent in the space defined between said sleeve member and said hollow rod.

4. An apparatus for pulling single crystals from melt comprising: a hollow rod having a seed crystal holder; carriage means in which said rod is mounted for reciprocating movement with said seed crystal along a vertical axis; a rotatably mounted screw member located adjacent to said carriage means extending substantially parallel to said hollow rod; a screw follower member mounted on said screw member and rigidly connected to said carriage means; means for rotating said screw member whereby said rod is axially moved along a vertical axis; drive means for rotating said rod in said carriage means including a central telescoping pipe assembly mounted within said hollow rod coaxially therewith, a space being defined between said central pipe assembly and said hollow rod, said central pipe assembly including a vertically fixed rotatable external member having a longitudinally extending groove formed on its external surface, a sleeve member located in the space defined between said rod and said external member, as internal member telescopingly associated with said external member, said inner member being rigidly attached to the lower end of said sleeve member, the latter being rigidly attached to said hollow rod; a radially extending pin rigidly secured at one of its ends to said hollow rod and the other of its ends extending into said longitudinal groove so that said hollow rod is rotatable around its longitudinal axis and reciprocable with said carriage means relative to said external member; and means for circulating a cooling agent in the space defined between said sleeve member and said hollow rod.

* * * * *